United States Patent
Ho et al.

(10) Patent No.: US 8,754,716 B2
(45) Date of Patent: Jun. 17, 2014

(54) RING OSCILLATOR

(75) Inventors: Ying-Chieh Ho, Zhubei (TW); Yu-Sheng Yang, Tainan (TW); Chau-Chin Su, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/595,247

(22) Filed: Aug. 27, 2012

(65) Prior Publication Data

US 2013/0049874 A1 Feb. 28, 2013

(30) Foreign Application Priority Data

Aug. 29, 2011 (TW) .............................. 100130922 A

(51) Int. Cl.
*H03K 5/15* (2006.01)
*H03K 5/00* (2006.01)

(52) U.S. Cl.
USPC ................ 331/57; 331/34; 327/261; 327/264

(58) Field of Classification Search
USPC ............................... 331/57, 34; 327/261, 264
See application file for complete search history.

(56) References Cited

PUBLICATIONS

Choe te al, —A 1V bootstrapped CMOS digital logic family—University of New South Wales, Sydney, Australia Oct. 1997; DOI.1109/ESSCIR.1997.186179 in proceeding of Solid-State Circuits Conference, 1997.ESSCIRC '97.*

* cited by examiner

*Primary Examiner* — Arnold Kinkead
(74) *Attorney, Agent, or Firm* — Muncy, Geissler, Olds & Lowe, P.C.

(57) ABSTRACT

A ring oscillator includes (2N+1) inverting delay circuit cells, and each delay circuit cell has an input port and an output port, where N is an integer larger than zero. Each of these (2N+1) inverting delay circuit cells receives a control voltage, and all of the (2N+1) inverting delay circuit cells are electrically connected with each other in series. Furthermore, the input port of one of the (2N+1) inverting delay circuit cells is electrically connected with the output port of an adjacent delay circuit cell of the (2N+1) inverting delay circuit cells.

6 Claims, 6 Drawing Sheets

RING OSCILLATOR

CROSS REFERENCE TO RELATED APPLICATION

This application claims the benefits of the Taiwan Patent Application Serial Number 100130922, filed on Aug. 29, 2011, the subject matter of which is incorporated herein by reference.

BACKGROUND OF THE INVENTION

1. Field of the Invention

The present invention relates to a ring oscillator and, more particularly, to a ring oscillator capable of operating under a low-voltage condition, while preserving excellent operating speed and linearity.

2. Description of Related Art

In recent years, the issue of environmental protection and energy efficiency is getting more and more important. For electronic products, it can be discussed in two aspects. First, for many kinds of electronic products, a battery is the main source for power supply, and thus to extend the lifetime of the battery is considered important. Second, with the technique of low-power circuit design, it is desirable to allow the circuit to maintain the efficiency that the circuit should meet under low-power consumption. Thus, the second aspect is equivalent to the effect of extending the lifetime of the battery. Accordingly, low-power circuit design is important to many current electronic devices with high precision, such as hand-held telecommunication products or PDAs.

Furthermore, combining multiple integrated circuits (ICs) of different functions on a single chip can now be done due to advanced semiconductor processes. This is the concept of system on chip (SoC) substituting for the traditional printed circuit board (PCB), and thus the volume and weight of electronic products are decreased.

It is known that the power consumption is related to the operating frequency, the load capacitance, and the operating voltage pursuant to theory of $P=fCV^2$, where P represents the power consumption; f represents the operating frequency; C represents the load capacitance and V represents the operating voltage. Thus, the most effective way is to reduce the operating voltage of the circuit if it is desired to reduce the power consumption of the circuit. Reducing the operating voltage allows the power consumption of the circuit to decrease correspondingly; even operating the circuit within the sub-threshold region is able to be done.

The threshold voltage ($V_{TH}$) of the transistor becomes the most critical issue while being operated under low-voltage operation. Due to the development of the semiconductor process, the operating voltage of circuits keeps decreasing, but the decreasing breadth on the threshold voltage of transistors is unable to meet the operating voltage. When the operating voltage decreases, the potential difference between gate and source of the transistor decreases as well, which causes the reduction of the driving current; whereby the time of charging and discharging the entire digital circuit also increases, and the operating speed of the circuit is lowered. This is shown in FIG. 1, in which the gate delay of the transistor increases dramatically when the operating voltage decreases. In addition to the operating speed on circuit, the effect on the entire system caused by process, voltage and temperature (PVT) variation is greater than while being operated under regular operating voltage. Therefore, process drift becomes very severe.

As described above, there are two main issues to confront when a circuit is operated under low-voltage operation. The first one is the degradation of driving ability; when the operating voltage decreases, the potential difference between gate and source of the transistor decreases as well, causing the operating speed of the circuit to slow down. For the second one, when the operating voltage of the circuit is in the sub-threshold region or in the neighbor of sub-threshold region, the effect on the system caused by process voltage temperature (PVT) variation is greater than that operated under regular operating voltage.

Therefore, it is desired to have an oscillator circuit which is capable of operating under low-voltage condition while preserving excellent operating speed and linearity.

SUMMARY OF THE INVENTION

It is one object of the present invention to provide a ring oscillator capable of operating under low-voltage condition, while preserving excellent operating speed and linearity.

It is another object of the present invention to provide a ring oscillator capable of allowing the output frequency to be highly linear with the control voltage, so as to suppress the corners variation.

To achieve the objects, the ring oscillator of the present invention comprises: (2N+1) inverting delay circuit cells each having an input port and an output port; wherein each delay circuit cell receives a control voltage, and the delay circuit cells are connected with each other in series, the input port of each delay circuit cell is electrically connected with the output port of another adjacent delay circuit cell, and a loop is formed through the delay circuit cells being connected in series, providing N is an integer larger than zero.

With the above description, it can be seen that the ring oscillator of the present invention is a circuit structure composed of at least three inverting delay circuit cells being connected in series. Moreover, the output port of the delay circuit cell connected at the end is electrically connected with the input port of the delay circuit cell connected at the beginning and thus the aforementioned loop structure is formed. Besides, the aforementioned delay circuit cell is preferably a bootstrap delay circuit cell.

Furthermore, in a first preferred embodiment, the aforementioned bootstrap delay circuit cell comprises: a first inverter having a first input node and a first output node; a second inverter having a second input node and a second output node; a first PMOS transistor having a source for receiving the control voltage; a first capacitor having two ends connected with the first output node of the first inverter and a drain of the first PMOS transistor, respectively; a second PMOS transistor having a gate and a source connected with the first input node of the first inverter and the drain of the first PMOS transistor, respectively; a first NMOS transistor having a gate and a drain connected with the first input node of the first inverter and a drain of the second PMOS transistor, respectively; a second NMOS transistor having a source connected with ground, and a drain connected with a source of the first NMOS transistor; and a second capacitor having two ends connected with the second output node of the second inverter and the drain of the second NMOS transistor; wherein the first input node and the second input node are connected together to form the input port; the gate of the first PMOS transistor, the drain of the second PMOS transistor, the drain of the first NMOS transistor, and the gate of the second NMOS transistor are connected together to form the output port.

It is noted that, in the aforementioned first preferred embodiment, the first inverter and the second inverter are preferably, but not limited to, CMOS inverters.

Further, in a second preferred embodiment, the aforementioned bootstrap delay circuit cell comprises: an inverter having an input node and an output node; a first PMOS transistor having a source for receiving the control voltage; a first NMOS transistor having a drain connected with a drain of the first PMOS transistor; a first capacitor having two ends connected with the output node and a source of the first NMOS transistor; a second NMOS transistor having a source connected with ground, and a drain connected with a source of the first NMOS transistor; a second PMOS transistor having a source for receiving the control voltage; a second capacitor having two ends connected with the output node and a drain of the second PMOS transistor; a third PMOS transistor having a source connected with the drain of the second PMOS transistor; a third NMOS transistor having a source connected with ground, and a drain connected with a drain of the third PMOS transistor; a fourth NMOS transistor having a drain connected with the drain of the first PMOS transistor; and a fourth PMOS transistor having a source and a drain connected with a source of the fourth NMOS transistor and a drain of the third PMOS transistor, respectively; wherein a gate of the first NMOS transistor, a gate of the first PMOS transistor, a gate of the third MMOS transistor, a gate of the third PMOS transistor, a gate of the fourth NMOS transistor, a gate of the fourth PMOS transistor, and the input node of the inverter are connected together to form the input port; the source of the fourth NMOS transistor and the source of the fourth PMOS transistor are connected together to form the output port.

Accordingly, in the aforementioned second preferred embodiment, the inverter is preferably, but not limited to, a CMOS inverter.

In addition, in a third preferred embodiment, the aforementioned bootstrap delay circuit cell comprises: an inverter having an input node and an output node; a first PMOS transistor having a source for receiving the control voltage; a second PMOS transistor having a source and a gate connected with a gate of the first PMOS transistor and the input node of the inverter, respectively; a first NMOS transistor having a drain and a gate connected with the gate of the first PMOS transistor and the input node of the inverter, respectively; a second NMOS transistor having a source connected with ground, a drain connected with a source of the first NMOS transistor, and a gate connected with the output node of the inverter; a first capacitor having two ends connected with the output node of the inverter and the gate of the second NMOS transistor, respectively; a second capacitor having two ends connected with the output node of the inverter and a drain of the second PMOS transistor, respectively; a third PMOS transistor having a source connected with ground, and a gate g connected with the output node of the inverter; a fourth PMOS transistor having a source and a gate connected with a drain of the third PMOS transistor and the input node of the inverter, respectively; a third NMOS transistor having a source and a gate connected with a drain of the fourth PMOS transistor and the input node of the inverter, respectively; a fourth NMOS transistor having a source connected with ground, a gate connected with the source of the third NMOS transistor, and a drain connected with a drain of the third NMOS transistor; a third capacitor having two ends connected with the output node of the inverter and the drain of the third NMOS transistor, respectively; a fourth capacitor having two ends connected with the output node of the inverter and the drain of the third PMOS transistor, respectively; a fifth PMOS transistor having a source connected with a drain of the first PMOS transistor; and a fifth NMOS transistor having a drain connected with the drain of the fourth NMOS transistor; wherein a gate of the fifth PMOS transistor and a gate of the fifth NMOS transistor are connected together to form the input port; a drain of the fifth PMOS transistor and a source of the fifth NMOS transistor are connected together to form the output port.

It is noted that (2N+1) is at least to be three as described above, which implies at least three delay circuit cells are employed. Further, the upper limit of N is not constrained. Besides, the aforementioned control voltage is not limited; however, the preferred range of the control voltage is between the operating voltage and the sub-threshold voltage of ordinary elements.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
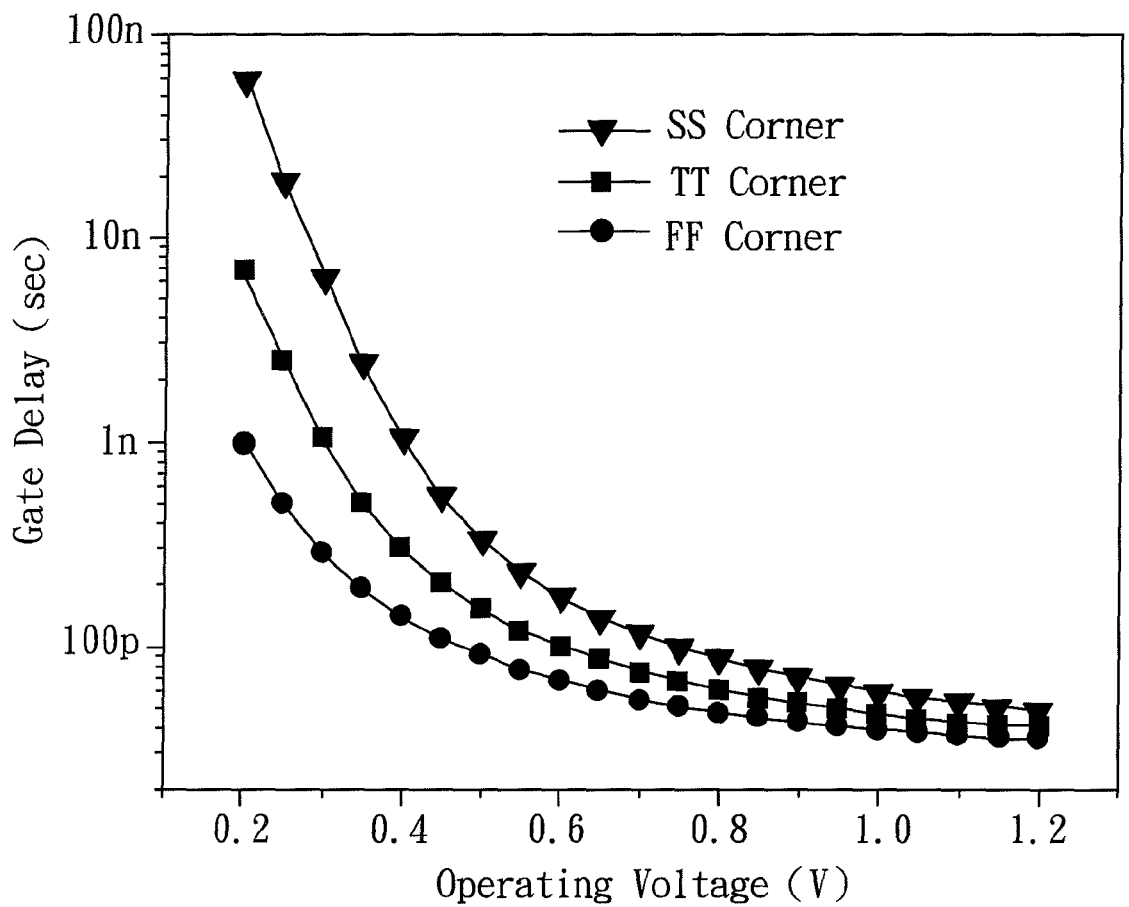
FIG. 1 is a schematic view illustrating the relation between the gate delay and the operating voltage.
Figure 2:
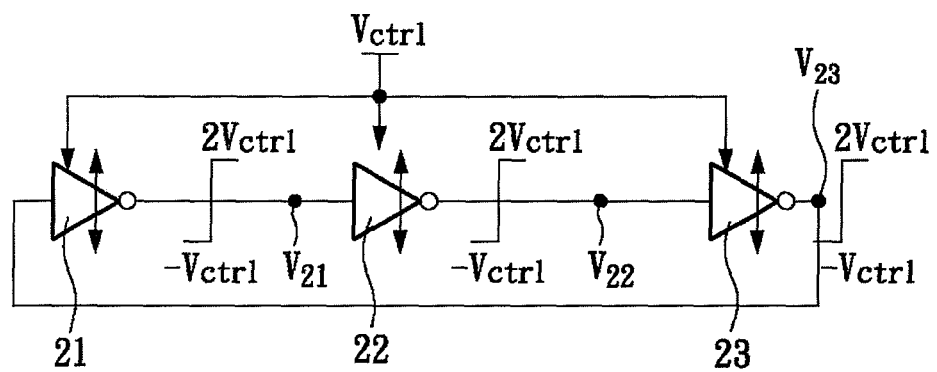
FIG. 2 is a schematic view illustrating the ring oscillator of the present invention.

With reference to FIG. 2, FIG. 2 is a schematic view illustrating the ring oscillator of the present invention. As shown in FIG. 2, the ring oscillator in accordance with the first embodiment of the present application is formed by connecting three delay circuit cells 21, 22 and 23, and the ring oscillator has three nodes $V_{21}$, $V_{22}$ and $V_{23}$. Moreover, each delay circuit cell receives a control voltage. Besides, as shown in FIG. 2, the three delay circuit cells 21, 22 and 23 are connected in series. It is to be noted that the input node of the delay circuit cell 21 is connected with the output node of the delay circuit cell 23 so as to form the node $V_{23}$, the input node of the delay circuit cell 22 is connected with the output node of the delay circuit cell 21 so as to form the node $V_{21}$, the input node of the delay circuit cell 23 is connected with the output node of the delay circuit cell 22 so as to form the node $V_{22}$, and thus a circular loop as shown in FIG. 2 is formed. Additionally, the number of the inverting delay circuit cells being used is not limited, but at least to be three.

In the ring oscillator of the first embodiment of the present invention, the processed elements with threshold voltage of approximately 0.3V are employed; therefore, the range of the control voltage $V_{ctrl}$ is between 0.2V and 0.3V. Further, the delay circuit cells 21, 22 and 23 are each a bootstrap delay circuit cell in the ring oscillator of the first embodiment of the present invention.

Figure 3:
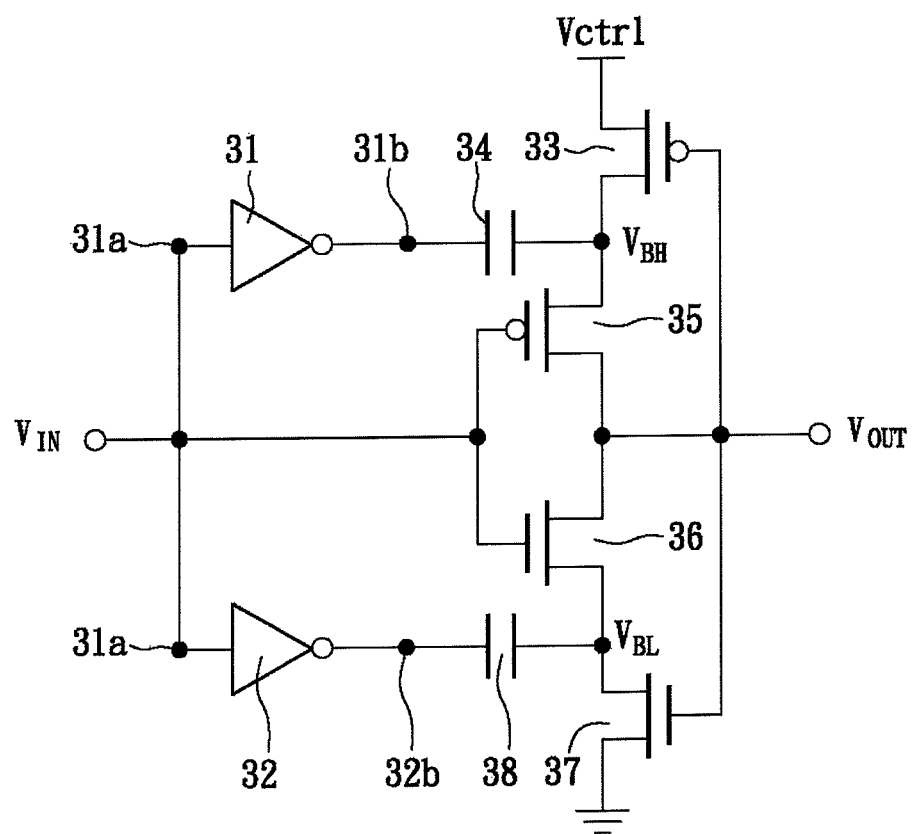
FIG. 3 is a schematic view illustrating the bootstrap delay circuit cell used in the ring oscillator according to the first embodiment of the present invention.

Furthermore, as for the circuit structure of the above mentioned bootstrap delay circuit cell, please refer to FIG. 3. FIG. 3 is a schematic view illustrating the bootstrap delay circuit cell used in the ring oscillator according to the first embodiment of the present invention. As shown in FIG. 3, the bootstrap delay circuit cell comprises: a first inverter 31, a second inverter 32, a first PMOS transistor 33, a first capacitor 34, a second PMOS transistor 35, a first NMOS transistor 36, a second NMOS transistor 37, and a second capacitor 38.

The first inverter 31 has a first input node 31a and a first output node 31b. The second inverter 32 has a second input node 32a and a second output node 32b. In addition, the drain of the first PMOS transistor 33 receives the control voltage $V_{ctrl}$, and the two ends of the first capacitor 34 are connected with the first output node 31b of the first inverter 31 and the drain of the first PMOS transistor 33, respectively.

The gate of the second PMOS transistor 35 is connected with the first input node 31a of the first inverter 31, and the drain of the second PMOS transistor 35 is connected with the drain of the first PMOS transistor 33. Moreover, the gate and the drain of the first NMOS transistor 36 are connected with the first input node 31a of the first inverter 31 and the drain of the second PMOS transistor 35, respectively. Additionally, the source of the second NMOS transistor 37 is connected with ground, and the drain of the second NMOS transistor 37 is connected with the drain of the first NMOS transistor 36.

Finally, the two ends of the second capacitor 38 are connected with the second output node 32b of the second inverter 32 and the drain of the second NMOS transistor 37, respectively. The first input node 31a and the second input node 32a are connected together to form the input port $V_{IN}$ (it is noted that the input port $V_{IN}$ of the first delay circuit cell arranged at the beginning of the serial circuit structure corresponds to $V_{23}$); and the gate of the first PMOS transistor 33, the drain of the second PMOS transistor 35, the drain of the first NMOS transistor 36, and the gate of the second NMOS transistor 37 are connected together to form the output port $V_{OUT}$ (it is noted that the output port $V_{OUT}$ of the last delay circuit cell arranged at the end of the serial circuit structure corresponds to $V_{23}$).

The detailed operation of the ring oscillator in accordance with the first embodiment of the present invention is described as follow:

When the input signal of the input port $V_{IN}$ falls from $V_{ctrl}$ to 0V, the voltage of the first output node 31b of the first inverter 31 rises from 0V to $V_{ctrl}$, and the rising edge passes through the first capacitor 34, letting the voltage of the node $V_{BH}$ rise from $V_{ctrl}$ to 2 $V_{ctrl}$. Meanwhile, the second PMOS transistor 35 is turned on to form a charging current for charging the parasitic capacitor of the output port $V_{OUT}$, thereby letting the output voltage of the output port $V_{OUT}$ rise to 2 $V_{ctrl}$, so as to enhance the ability of discharging to the circuit at the next stage. In the meantime, the second NMON transistor 37 is turned on to pre-discharge the node $V_{BL}$, thereby letting the voltage of the node $V_{BL}$ return to 0V.

When the input signal of the input port $V_{IN}$ rises from 0V to $V_{ctrl}$, the voltage of the second output node 32b of the second inverter 32 falls from $V_{ctrl}$ to 0V, and the falling edge passes through the second capacitor 38, letting the voltage of the node $V_{BH}$ fall from 0V to $-V_{ctrl}$. Therefore, the voltage of the output port $V_{OUT}$ is discharged to $-V_{ctrl}$ so as to enhance the ability of charging to the circuit at the next stage. In the meantime, the first PMON transistor 33 is turned on to pre-charge the node $V_{BH}$, thereby letting the voltage of the node $V_{BH}$ return to $V_{ctrl}$.

It is noted that the voltage signal on each point $V_{21}$, $V_{22}$ or $V_{23}$ in FIG. 2 is signal that has been voltage-boosted, and the voltage signal is a swing signal of 2 $V_{ctrl}$ to $-V_{ctrl}$, so that the ability of driving the circuit is enhanced.

Figure 6:
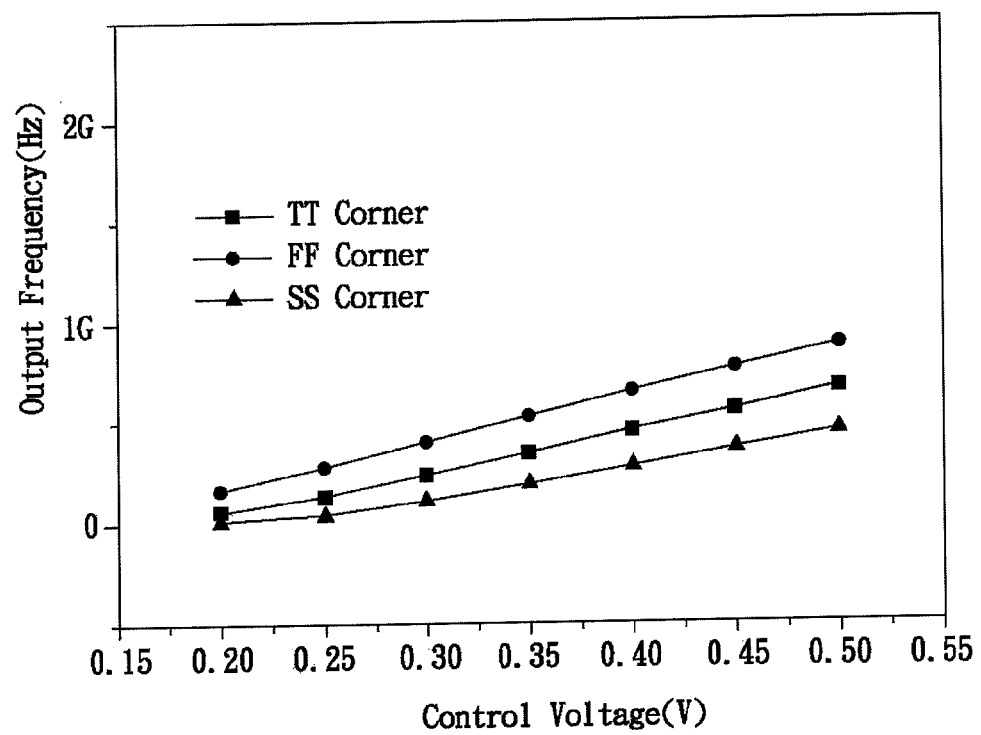
FIG. 6 is a schematic view illustrating the relation between the output frequency and the control voltage of the ring oscillator of the present invention.

With reference to FIG. 6, FIG. 6 is a schematic view illustrating the relation between the output frequency and the control voltage of the ring oscillator of the present invention, wherein the horizontal axis represents control voltage and the vertical axis represents output frequency. According to FIG. 6, it can be seen that no matter under what kinds of corner (FF corner, TT corner, SS corner), the ring oscillator of the present invention preserves excellent operating speed and linearity under low-voltage operation.

According to the above description and drawings, the ring oscillator of the present invention utilizes rising gate voltage to enable each delay circuit, after being voltage-boosted, to provide a tremendous voltage swing from 2$V_{ctrl}$ to $-V_{ctrl}$ accordingly. This allows each delay circuit cell to be able to operate under triode region no matter if the control voltage of each delay circuit is higher or lower than the threshold voltage. Thus, the ring oscillator of the present invention is provided with excellent operating speed, and the output frequency and the control voltage of the ring oscillator of the present invention are related in high linearity.

Embodiment 2

Figure 4:
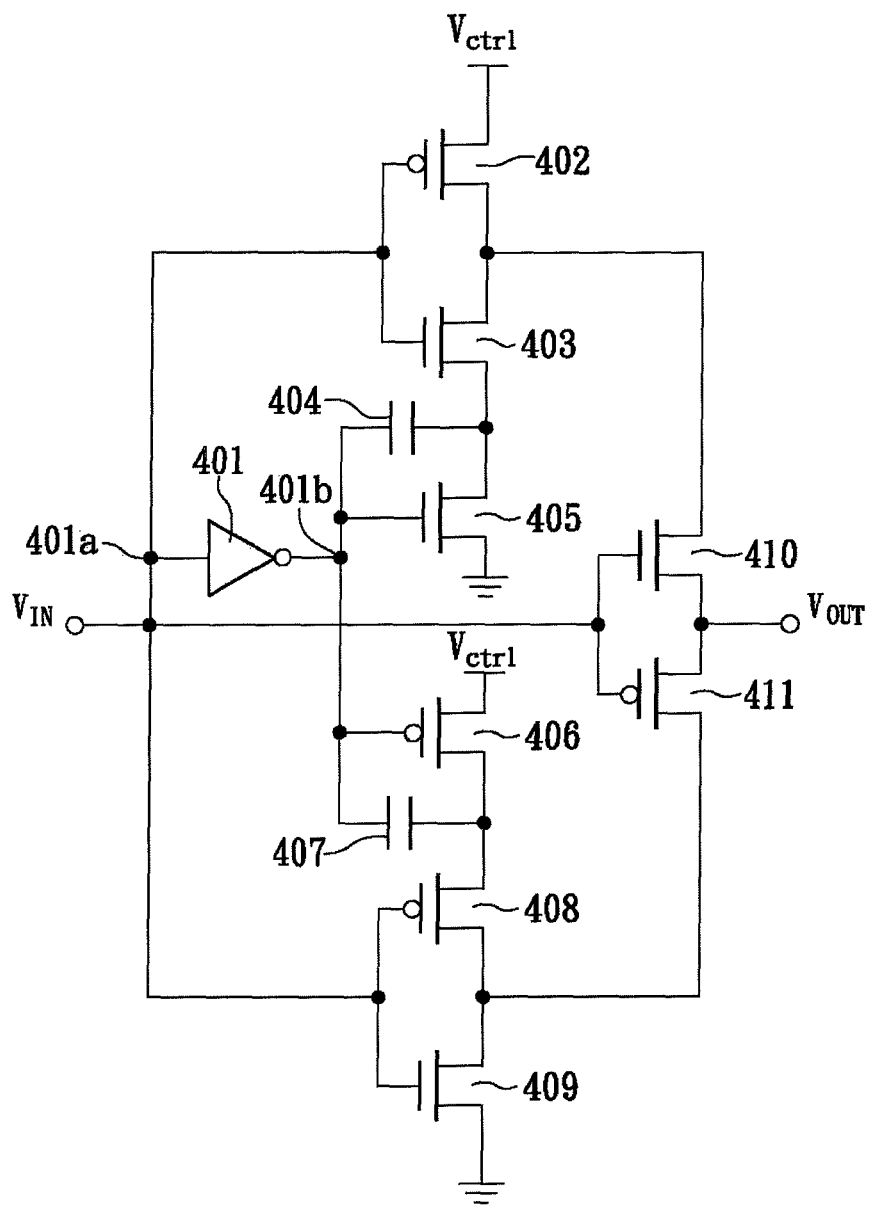
FIG. 4 is a schematic view illustrating the bootstrap delay circuit cell used in the ring oscillator according to the second embodiment of the present invention.

The ring oscillator of the second embodiment of the present invention is similar to that of the first embodiment, except that a different circuit structure of the bootstrap delay circuit cell is adopted. With reference to FIG. 4, FIG. 4 is a schematic view illustrating the bootstrap delay circuit cell used in the ring oscillator according to the second embodiment of the present invention.

As shown in FIG. 4, the bootstrap delay circuit cell used in the ring oscillator according to the second embodiment of the present invention comprises: an inverter 401, a first PMOS transistor 402, a first NMOS transistor 403, a first capacitor 404, a second NMOS transistor 405, a second PMOS transistor 406, a second capacitor 407, a third PMOS transistor 408, a third NMOS transistor 409, a fourth NMOS transistor 410, and a fourth PMOS transistor 411.

The inverter 401 has an input node 401a and an output node 401b. In addition, the drain of the first PMOS transistor 402 receives the control voltage $V_{ctrl}$. The drain of the first NMOS transistor 403 is connected with the drain of the first PMOS transistor 402. The two ends of the first capacitor 404 are connected with the output node 401b and the source of the first NMOS transistor 403, respectively.

The drain of the second NMOS transistor 405 is connected with the drain of the first NMOS transistor 403, and the drain of the second PMOS transistor 406 receives the control voltage $V_{ctrl}$. Moreover, the two ends of the second capacitor 407 are connected with the output node 401b and the drain of the second PMOS transistor 406, respectively. Further, the drain of the third PMOS transistor 408 is connected with the drain of the second PMOS transistor 406. The source of the third NMOS transistor 409 is connected with ground, and the drain of the third NMOS transistor 409 is connected with the drain of the third PMOS transistor 408.

The drain of the fourth NMOS transistor 410 is connected with the drain of the first PMOS transistor 402. The source and the drain of the fourth PMOS transistor 411 are connected with the source of the fourth NMOS transistor 410 and the drain of the third PMOS transistor 408, respectively. The gate of the first NMOS transistor 403, the gate of the first PMOS transistor 402, the gate of the third MMOS transistor 409, the gate of the third PMOS transistor 408, the gate of the fourth NMOS transistor 410, the gate of the fourth PMOS transistor 411, and the input node 401a of the inverter 401 are connected together to form the input port $V_{IN}$ (it is noted that the input port $V_{IN}$ of the first delay circuit cell arranged at the beginning of the serial circuit structure corresponds to $V_{23}$), and the source of the fourth NMOS transistor 410 and the source of the fourth PMOS transistor 411 are connected together to form the output port $V_{OUT}$ (it is noted that the output port $V_{OUT}$ of the last delay circuit cell arranged at the end of the serial circuit structure corresponds to $V_{23}$).

For this second embodiment, only the circuit structure of the bootstrap delay circuit cell is depicted since this is the only difference between the second embodiment and the first embodiment, and thus a detailed description to the theory and the efficiency of the second embodiment is deemed unnecessary.

Embodiment 3

Figure 5:
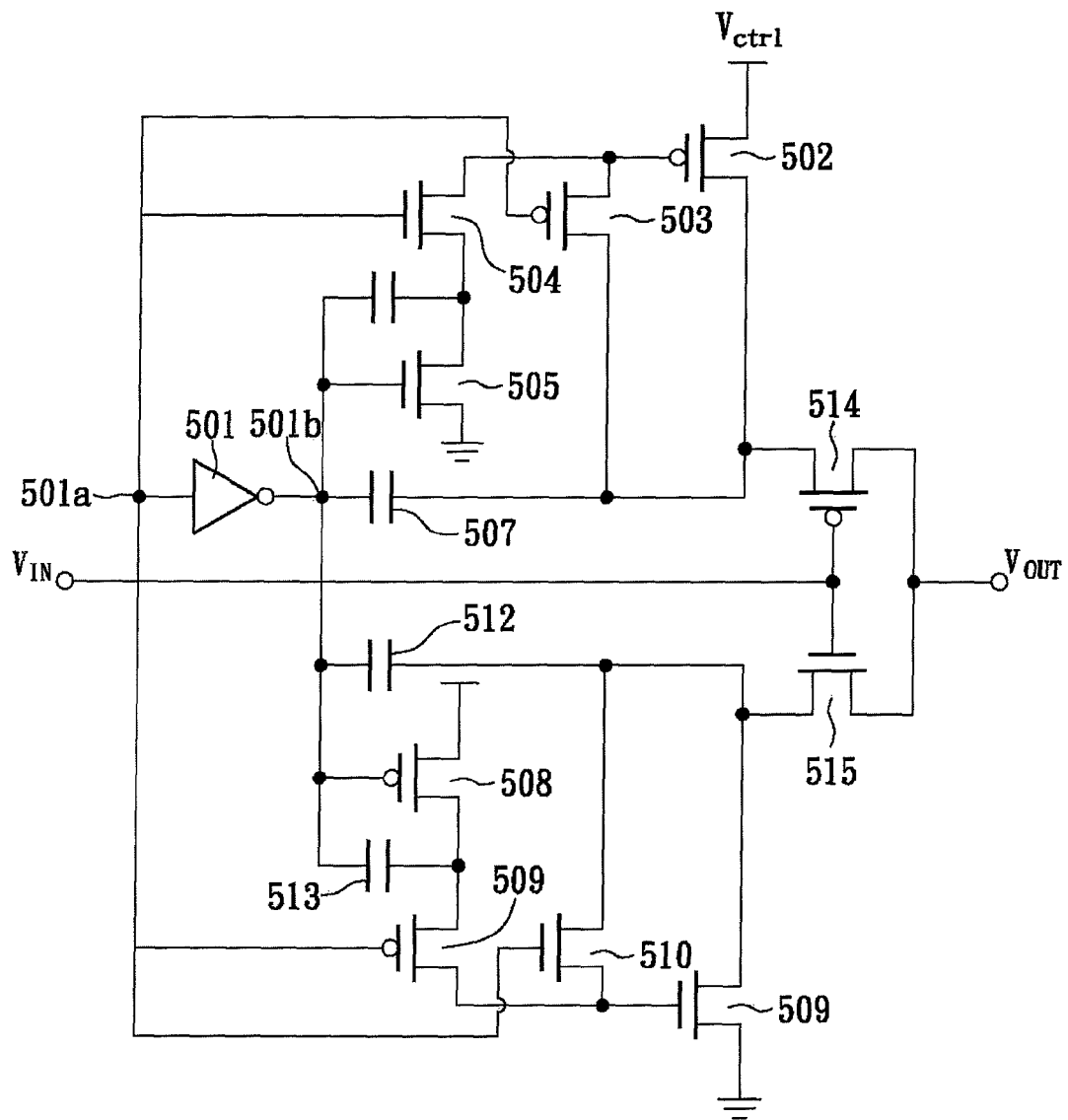
FIG. 5 is a schematic view illustrating the bootstrap delay circuit cell used in the ring oscillator according to the third embodiment of the present invention.

The ring oscillator of the third embodiment of the present invention is similar to that of the first embodiment, except that a different circuit structure of the bootstrap delay circuit cell is adopted. With reference to FIG. 5, FIG. 5 is a schematic view illustrating the bootstrap delay circuit cell used in the ring oscillator according to the third embodiment of the present invention.

As shown in FIG. 5, the bootstrap delay circuit cell used in the ring oscillator according to the third embodiment of the present invention comprises: an inverter 501, a first PMOS transistor 502, a second PMOS transistor 503, a first NMOS transistor 504, a second NMOS transistor 505, a first capacitor 506, a second capacitor 507, a third PMOS transistor 508, a fourth PMOS transistor 509, a third NMOS transistor 510, a fourth NMOS transistor 511, a third capacitor 512, a fourth capacitor 513, a fifth PMOS transistor 514, and a fifth NMOS transistor 515.

The inverter 501 has an input node 501a and an output node 501b. In addition, the source of the first PMOS transistor 502 receives the control voltage $V_{ctrl}$. The source and the gate of the second PMOS transistor 503 are connected with the gate of the first PMOS transistor 502 and the input node 501a of the inverter 501, respectively. Besides, the drain and the gate of the first NMOS transistor 504 are connected with the gate of the first PMOS transistor 502 and the input node 501a of the inverter 501, respectively.

The source of the second NMOS transistor 505 is connected with ground. The drain and the gate of the second NMOS transistor 505 are connected with the source of the first NMOS transistor 504 and the output node 501b of the inverter 501, respectively. Moreover, the two ends of the first capacitor 506 are connected with the output node 501b of the inverter 501 and the gate of the second NMOS transistor 505, respectively. The two ends of the second capacitor 507 are connected with the output node 501b of the inverter 501 and the drain of the second PMOS transistor 503, respectively.

The source of the third PMOS transistor 508 is connected with ground, and the gate of the third PMOS transistor 508 is connected with the output node 501b of the inverter 501. The source and the gate of the fourth PMOS transistor 509 are connected with the drain of the third PMOS transistor 508 and the input node 501a of the inverter 501, respectively. Moreover, the source and the gate of the third NMOS transistor 510 are connected with the drain of the fourth PMOS transistor 509 and the input node 501a of the inverter 501, respectively. The source of the fourth NMOS transistor 511 is connected with ground. The gate and the drain of the fourth NMOS transistor 511 are connected with the source of the third NMOS transistor 510 and the drain of the third NMOS transistor 510, respectively.

The two ends of the third capacitor 512 are connected with the output node 501b of the inverter 501 and the drain of the third NMOS transistor 510, respectively. The two ends of the fourth capacitor 513 are connected with the output node 501b of the inverter 501 and the drain of the third PMOS transistor 508, respectively.

The source of the fifth PMOS transistor 514 is connected with the drain of the first PMOS transistor 502. The drain of fifth NMOS transistor 515 is the connected with the drain of the fourth NMOS transistor 511. The gate of the fifth PMOS transistor 514 and the gate of the fifth NMOS transistor 515 are connected together to form the input port $V_{IN}$ (it is noted that the input port $V_{IN}$ of the first delay circuit cell arranged at the beginning of the serial circuit structure corresponds to $V_{23}$). The drain of the fifth PMOS transistor and the source of the fifth NMOS transistor are connected together to form the output port $V_{OUT}$ (it is noted that the output port $V_{OUT}$ of the last delay circuit cell arranged at the end of the serial circuit structure corresponds to $V_{23}$).

For this third embodiment, only the circuit structure of the bootstrap delay circuit cell is depicted since this is the only difference between the third embodiment and the first embodiment, and thus a detailed description to the theory and the efficiency of the third embodiment is deemed unnecessary.

In view of the foregoing, it is known that, in the ring oscillator of the present invention, since the input voltage and the output voltage of each delay circuit cell at each stage are boosted to $2V_{ctrl}$ and $-V_{ctrl}$; each transistor is able to operate far away from the sub-threshold region. Therefore, excellent linearity between output frequency and control voltage is available, and impact on process variation is smaller than the prior structure.

Although the present invention has been explained in relation to its preferred embodiment, it is to be understood that many other possible modifications and variations can be made without departing from the spirit and scope of the invention as hereinafter claimed.

What is claimed is:

1. A ring oscillator, comprising:
   (2N+1) inverting delay circuit cells each having an input port and an output port;
   wherein each delay circuit cell receives a control voltage, and the delay circuit cells are connected with each other in series, the input port of each delay circuit cell is electrically connected with the output port of another adjacent delay circuit cell, and a loop is formed through the delay circuit cells being connected in series, providing N is an integer larger than zero;
   wherein the delay circuit cell is a bootstrap delay circuit cell, each of the delay circuit cells outputs a voltage swing from $2V_{ctrl}$ to $-V_{ctrl}$, where $V_{ctrl}$ is a control voltage.

2. The ring oscillator as claimed in claim 1, wherein the bootstrap delay circuit cell comprises:

a first inverter having a first input node and a first output node;
a second inverter having a second input node and a second output node;
a first PMOS transistor having a source for receiving the control voltage;
a first capacitor having two ends connected with the first output node of the first inverter and a drain of the first PMOS transistor, respectively;
a second PMOS transistor having a gate and a source connected with the first input node of the first inverter and the drain of the first PMOS transistor, respectively;
a first NMOS transistor having a gate and a drain connected with the first input node of the first inverter and a drain of the second PMOS transistor, respectively;
a second NMOS transistor having a source connected with ground, and a drain connected with a source of the first NMOS transistor; and
a second capacitor having two ends connected with the second output node of the second inverter and the drain of the second NMOS transistor;
wherein the first input node and the second input node are connected together to form the input port; the gate of the first PMOS transistor, the drain of the second PMOS transistor, the drain of the first NMOS transistor, and the gate of the second NMOS transistor are connected together to form the output port.

3. The ring oscillator as claimed in claim 2, wherein the first inverter and the second inverter each is a CMOS inverter.

4. The ring oscillator as claimed in claim 1, wherein the bootstrap delay circuit cell comprises:
an inverter having an input node and an output node;
a first PMOS transistor having a source for receiving the control voltage;
a first NMOS transistor having a drain connected with a drain of the first PMOS transistor;
a first capacitor having two ends connected with the output node and a source of the first NMOS transistor, respectively;
a second NMOS transistor having a source connected with ground, and a drain connected with a source of the first NMOS transistor;
a second PMOS transistor having a source for receiving the control voltage;
a second capacitor having two ends connected with the output node and a drain of the second PMOS transistor, respectively;
a third PMOS transistor having a source connected with the drain of the second PMOS transistor;
a third NMOS transistor having a source connected with ground, and a drain connected with a drain of the third PMOS transistor;
a fourth NMOS transistor having a drain connected with the drain of the first PMOS transistor; and
a fourth PMOS transistor having a source and a drain connected with a source of the fourth NMOS transistor and a drain of the third PMOS transistor, respectively;
wherein a gate of the first NMOS transistor, a gate of the first PMOS transistor, a gate of the third MMOS transistor, a gate of the third PMOS transistor, a gate of the fourth NMOS transistor, a gate of the fourth PMOS transistor, and the input node of the inverter are connected together to form the input port; the source of the fourth NMOS transistor and the source of the fourth PMOS transistor are connected together to form the output port.

5. The ring oscillator as claimed in claim 4, wherein the inverter is a CMOS inverter.

6. The ring oscillator as claimed in claim 1, wherein the bootstrap delay circuit cell comprises:
an inverter having an input node and an output node;
a first PMOS transistor having a source for receiving the control voltage;
a second PMOS transistor having a source and a gate connected with a gate of the first PMOS transistor and the input node of the inverter, respectively;
a first NMOS transistor having a drain and a gate connected with the gate of the first PMOS transistor and the input node of the inverter, respectively;
a second NMOS transistor having a source connected with ground, a drain connected with a source of the first NMOS transistor, and a gate connected with the output node of the inverter;
a first capacitor having two ends connected with the output node of the inverter and the gate of the second NMOS transistor, respectively;
a second capacitor having two ends connected with the output node of the inverter and a drain of the second PMOS transistor, respectively;
a third PMOS transistor having a source connected with ground, and a gate connected with the output node of the inverter;
a fourth PMOS transistor having a source and a gate connected with a drain of the third PMOS transistor and the input node of the inverter, respectively;
a third NMOS transistor having a source and a gate connected with a drain of the fourth PMOS transistor and the input node of the inverter, respectively;
a fourth NMOS transistor having a source connected with ground, a gate connected with the source of the third NMOS transistor, and a drain connected with a drain of the third NMOS transistor;
a third capacitor having two ends connected with the output node of the inverter and the drain of the third NMOS transistor, respectively;
a fourth capacitor having two ends connected with the output node of the inverter and the drain of the third PMOS transistor, respectively;
a fifth PMOS transistor having a source connected with a drain of the first PMOS transistor; and
a fifth NMOS transistor having a drain connected with the drain of the fourth NMOS transistor;
wherein a gate of the fifth PMOS transistor and a gate of the fifth NMOS transistor are connected together to form the input port; a drain of the fifth PMOS transistor and a source of the fifth NMOS transistor are connected together to form the output port.

* * * * *